United States Patent [19]

Hyde et al.

[11] Patent Number: 4,593,248
[45] Date of Patent: Jun. 3, 1986

[54] OXYMETER

[75] Inventors: James S. Hyde, Dousman, Wis.; Wojciech Froncisz, Cracow, Poland; Ching-San Lai, Wauwatosa, Wis.

[73] Assignee: The Medical College of Wisconsin, Inc., Milwaukee, Wis.

[21] Appl. No.: 593,900

[22] Filed: Mar. 27, 1984

[51] Int. Cl.⁴ .................................................. G01R 33/20
[52] U.S. Cl. ...................................... 324/317; 324/300
[58] Field of Search ............... 324/300, 316, 317, 318, 324/322

[56] References Cited

U.S. PATENT DOCUMENTS

| | | | |
|---|---|---|---|
| 3,197,692 | 7/1965 | Hyde | 324/317 |
| 3,350,633 | 10/1967 | Hyde | 324/316 |
| 3,371,271 | 2/1968 | Takeuchi | 324/317 |
| 3,372,331 | 3/1968 | Larson | 324/317 |
| 3,585,494 | 6/1971 | Bozanic | 324/317 |
| 4,185,237 | 1/1980 | Uehara | 324/317 |

Primary Examiner—Michael J. Tokar
Attorney, Agent, or Firm—Barry E. Sammons

[57] ABSTRACT

An ESR spectrometer is employed to measure the oxygen concentration in a sample material. Electron paramagnetic resonance is produced in a free radical mixed with a standard material of known oxygen concentration. The phase of the signal produced by this resonance is compared with the phase of the signal produced by the electron paramagnetic resonance of the free radical mixed with the sample material. The oxygen concentration in the sample material has a single valued functional relationship with respect to this phase difference and is calculated in a microprocessor-based control system. At low oxygen concentrations, the relationship is a linear one.

10 Claims, 11 Drawing Figures

OXYMETER

BACKGROUND OF THE INVENTION

The field of the invention is oxymetry, and particularly, the measurement of oxygen concentration using electron spin resonance (ESR) spectrometers.

ESR spectrometers measure electron paramagnetic resonance signals. The Larmor theorem states that when electrons are subjected to a strong magnetic field they will precess about the axis of the field at a frequency which is directly proportional to the magnetic field strength. If a sample to be analyzed is subjected to a strong d.c. "polarizing" magnetic field and is at the same time irradiated by a radio frequency "source" magnetic field at the electron's frequency of precession, then electron resonance occurs. ESR spectrometers observe the effects of this resonance.

ESR spectrometers produce electron resonance by applying a radio frequency source magnetic field to the sample material while it is disposed within a polarizing magnetic field. A low frequency "reference" magnetic field modulates the polarizing magnetic field causing the sample material to pass through gyromagnetic resonance during each cycle of the reference field. At resonance the sample material produces a radio frequency signal which has components that are in-phase with the applied radio frequency source field and components that are ninety degrees out of phase with the source field. These components may be detected separately by ESR spectrometers when the spectrometer is operated in the "absorption mode" or the "dispersion mode." These two signal modes are referred to as the "v" and "u" modes in a notation introduced by F. Bloch, in the *Physical Review*, Volume 70, page 460, 1946. These signal modes are also known as the imaginary and real parts of the complex magnetic susceptibility. When gyromagnetic resonance occurs, the absorption signal mode is accompanied by a change in the resonator Q, or quality factor, and the dispersion signal mode is accompanied by a change in the resonant frequency of the resonator. At a detection point, as for example, a microwave diode, where the radio frequency source signal is rectified, the absorption and dispersion signal modes are characterized as radio frequency voltages in quadrature with each other. These two phase-displaced signals can be detected separately by applying a radio frequency signal to the detector which is "in-phase" with the source signal or by applying a radio frequency signal to the detector which "out-of-phase", or in quadrature, with the source signal.

The absorption mode signals and the dispersion mode signals both provide specific information concerning the structure and changes of the atomic and molecular particles in the sample material. However, an experimental problem has long existed in the detection of the dispersion mode signal by ESR spectrometers. More specifically, when the spectrometer is set to the dispersion mode, it demodulates the phase noise in the radio frequency source signal. The amount of this demodulated phase noise depends on the Q of the resonator which contains the sample material, the phase noise in the radio frequency source oscillator, and the amount of radio frequency power applied to the sample. This demodulated phase noise of the source signal obscures the gyromagnetic dispersion mode signal. Although a number of solutions have been found to this problem, these solutions are expensive and complex and are only practical in a laboratory environment.

The measurement of dissolved oxygen concentration levels in biological systems and the measurement of the rate of change of oxygen concentration in such systems provides valuable information. Such measurements have been made for a number of years using laboratory ESR spectrometers as reported in *The Proceedings of the National Academy of Science USA*, Volume 79, pages 1166–1170, published in February 1982. The physical basis for such measurement methods relies on the "Heisenberg" exchange between molecular oxygen in the system and a nitroxide radical spin-label material which is added to the biological system for measurement purposes. One such label is 3-carbamoyl-2, 2, 5, 5-tetramethyl-3-pyrroline-1-yloxyl, known in the art as "CTPO". It is commercially available from Aldrich Chemical Co. This exchange occurs at the bimolecular collision rate ($\omega$) determined by the Smoluchowski equation:

$$\omega = 4\pi RD[O_2]$$

where R is the interaction distance; D is the diffusion constant of molecular oxygen; and $[O_2]$ is the concentration of molecular oxygen. The measurement of this exchange rate ($\omega$) provides a direct measurement of the diffusion-oxygen concentration product (R is generally assumed to be a constant 4.5 angstroms). In addition, the rate of change of the exchange rate ($\omega$) provides a direct measurement of the rate of change of oxygen concentration, since the diffusion constant D remains relatively constant in any given system.

ESR spectrometers have been employed to measure the collision rate ($\omega$) between molecular oxygen $[O_2]$ and a nitroxide radical spin-label material using a number of methods. In one method the absorption signal produced by small nitroxide radicals freely tumbling in solution is observed. The resolution of this signal, however, tends to disappear in the presence of molecular oxygen at concentrations of biological relevance. This method, referred to in the art as the $T_2$ oximetric method, thus has a limited range and does not work in viscous environments where the nitroxide radicals are not freely tumbling.

Another ESR spectrometer method for measuring the collision rate ($\omega$) between molecular oxygen and nitroxide radical spin-labels may employ measurement of either the absorption or the dispersion signal. This method measures changes in the spin-lattice relaxation time $T_1$ which is the time it takes for the electrons to return to their unexcited state after the signals which produce electron spin resonance are removed. The $T_1$ time of the spin-label is mediated by the Heisenberg exchange with molecular oxygen and its measurement provides a sensitive measurement of the collision rate over a broad range of oxygen concentration levels. Although this measurement technique has been employed in the laboratory, the equipment required is too complex and expensive for commercial applications.

SUMMARY OF THE INVENTION

The present invention relates to an oxygen concentration measurement instrument which employs electron spin resonance techniques. The sample material to be measured is mixed with a free radical, such as a stable spin-label material, and is subjected to a polarizing field, a radio frequency source field and a low frequency reference field. The spectrometer operates in the dispersion mode to detect the quadrature component of the radio frequency ESR signal produced by both the spin-label in the sample material and the spin-label in a standard material of known oxygen concentration. The phase of the demodulated ESR signal produced by the sample material is then determined with respect to the phase of the ESR signal produced by the standard, or reference, sample of known oxygen concentration. The phase difference provides an indication of oxygen concentration in the sample material.

The shape and amplitude of the ESR signal reflected from the sample material and the reference material is affected by the strength of the source field, the frequency and amplitude of the reference field, and the spin-lattice relaxation time. This is referred to in the published literature as the "passage" phenomena. The passage phenomena is very sensitive to changes in spin-lattice relaxation time, and it is a teaching of the present invention that this sensitivity to changes in spin-lattice relaxation time can be exploited to measure oxygen collisions with free radicals. This in turn can be translated into an oxygen concentration value by comparison with the signal produced by the standard material.

A general object of the invention is to provide a sensitive oxymeter. Very low levels of oxygen can be detected in substances by comparing the phase of the demodulated ESR signal with the phase of a signal produced by a substance of known oxygen concentration.

Another object of the invention is to reduce the phase noise in a spectrometer operating in the dispersion mode. This is accomplished by employing a loop-gap resonator to contain the material under test. The loop-gap resonator has a lower quality factor, or Q, than cavity resonators, and it enables a higher energy density to be applied to the sample material for a given incident radio frequency power.

Another object of the invention is to provide an oxymeter which is self-calibrating. Variations in the measurement due to changes in applied power, frequency, and temperature are accounted for by employing the same apparatus to measure the oxygen concentration of the standard sample. A two or three-loop resonator network enables the sample and the standard to be subjected to identical measurement conditions.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
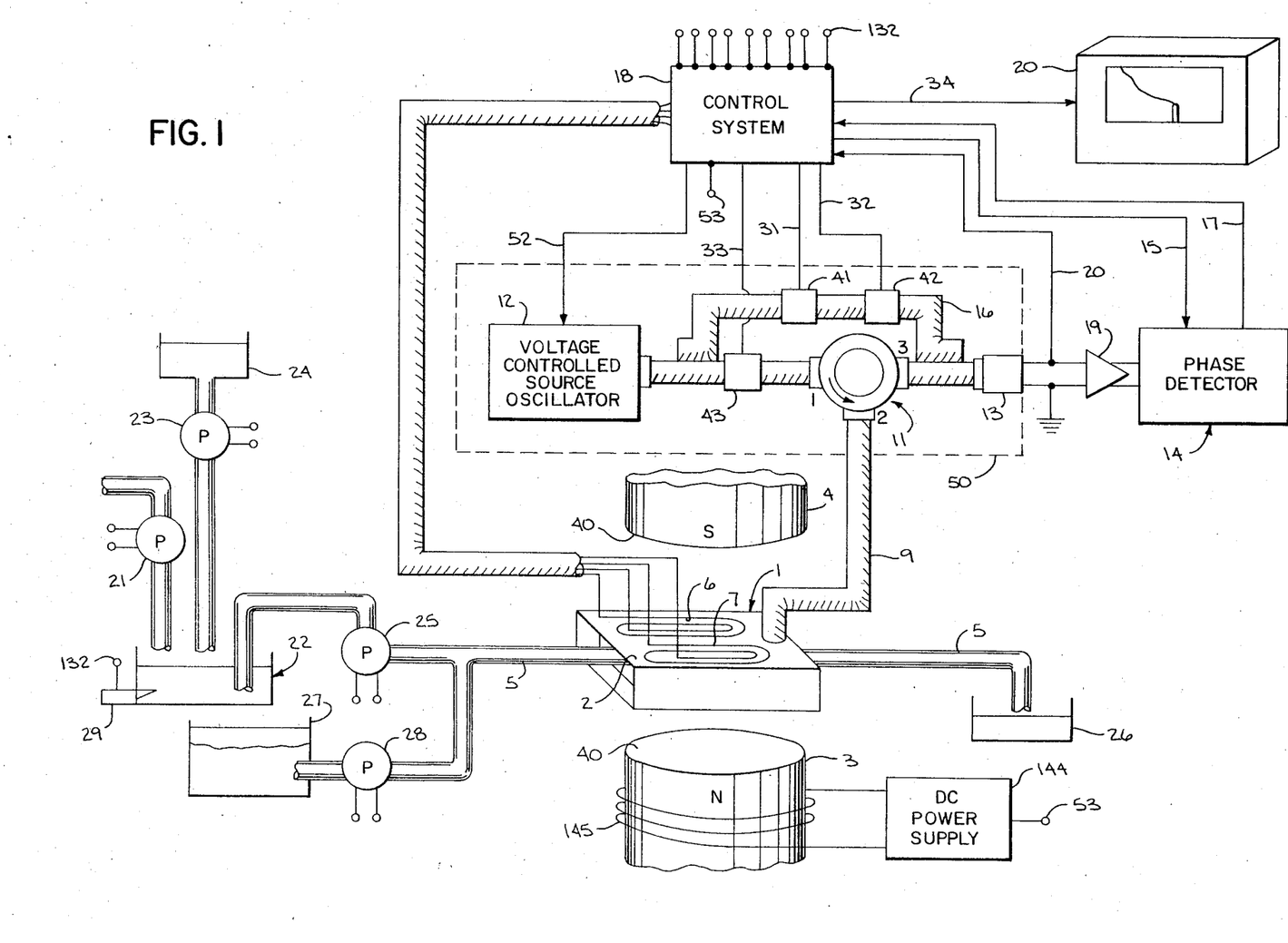
FIG. 1 is a schematic diagram of an oxygen concentration measurement instrument which embodies the present invention.

Referring particularly to FIG. 1, the spectrometer is formed around a loop-gap resonator network 1 which is disposed in a rectangular shield 2. The resonator network 1 is positioned between two poles 3 and 4 of a magnetic circuit, and a sample tube 5 extends through the resonator network 1. Modulation coils 6 and 7 are disposed on the resonator shield 2, adjacent the face of the pole 4. The modulator coils 6 and 7 are connected through a cable 8 to receive a 100 KHz reference signal from a control system 18.

Figure 2:
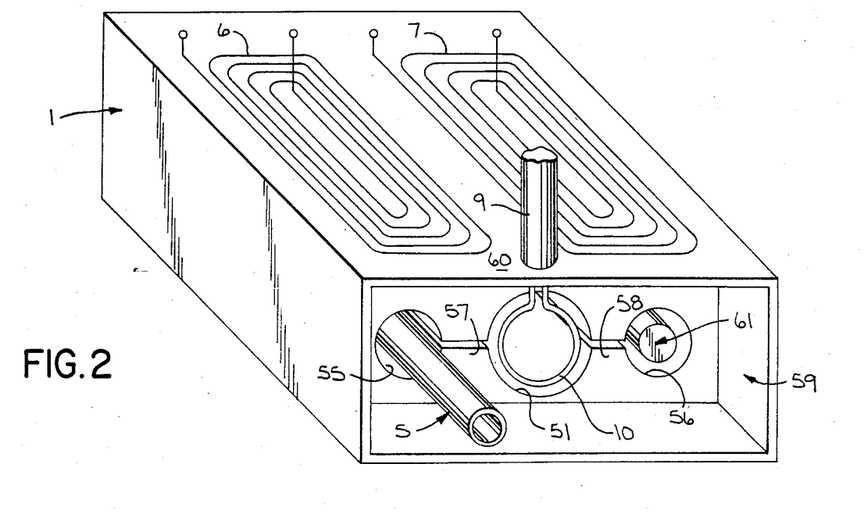
FIG. 2 is a perspective view of a resonator and supporting structure which form part of the instrument of FIG. 1.

A radio frequency electromagnetic field produced by a microwave bridge 50 is coupled to the loop-gap resonator network 1 through a coaxial cable 9. As shown in FIG. 2, a loop 10 is formed at the end of the cable 9 and this is positioned at one end of a central loop 51 in the resonator network 1. Referring again to FIG. 1, the other end of the cable 9 connects to port two on a microwave circulator 11 which forms part of the bridge 50. Port one of the circulator 11 is driven by a voltage controlled source oscillator 12 which is responsive to a frequency control signal on line 52 to tune it to the resonant frequency of the loop-gap resonator network 1. Port three of the circulator 11 connects to a crystal detector 13 which receives the ESR microwave signal reflected back from the loop-gap resonator network 1. This microwave signal is a carrier for magnetic resonance information at the 100 kHz reference frequency. The crystal detector 13 also receives a reference microwave signal through a reference arm 16 which is mixed with the reflected ESR signal. The detected microwave carrier output signal from the detector 13 is coupled through an operational amplifier 19 to the input of a 100 kHz phase detector circuit 14. The detector circuit 14 determines the amplitude of that portion of the 100 kHz reflected signal which is in phase with a detector reference signal received through line 15 from the control system 18. The resulting analog output signal from the phase detector 14 is applied through line 17 to an input port on the control system 18. The output of the crystal detector 13 is also applied to an analog input port on the control system 18 through a line 20. As will be explained in more detail below, this signal is employed to tune the source oscillator 12 to the resonant frequency of the network 1.

The control system 18 is a microprocessor-based system which is programmed to control not only the ESR spectrometer, but also the pumps which supply sample material for analysis. These include a supply pump 21 which controls the flow of liquid to be tested into a mixing tank 22, and a label pump 23 which controls the flow of spin-label material, from a supply tank 24. The spin-label material is thoroughly mixed with the liquid under test in the tank 22 and a sample of the mixture is periodically pumped into the sample tube 5 by a pump 25. The oxygen concentration measurement is made and then the sample material is flushed from the tube 5 into a drain 26 by the next sample to be measured. A level detector 29 is mounted to the mixing tank 22 and its output signal changes state when the level in the tank 22 drops too low. An enclosed tank 27 is also coupled to the input of the sample tube 5 by a pump 28. The tank 27 is filled with water which is used to flush the tube 5. Depending on the particular application, the volume of the sample material may range from microliters to liters.

Referring particularly to FIG. 2, the loop-gap network 1 employed in the spectrometer of FIG. 1 is a lumped circuit resonator which is constructed according to the teachings of co-pending U.S. patent applications Ser. No. 310,231, filed on Oct. 10, 1981, and entitled "Microwave Resonator" now Pat. No. 4,446,429; Ser. No. 361,595, filed on Mar. 25, 1982, and entitled "Microwave Resonator Structure" now Pat. No. 4,435,680; and Ser. No. 464,473, filed on Feb. 7, 1983, and entitled "Loopgap Resonator Network" now Pat. No. 4,480,239. The network 1 has a rectangular shape with a large opening made through its center to form the central loop 51. Smaller openings are disposed to each side of the central loop 51 to form first and second satellite loops 55 and 56. The satellite loops 55 and 56 are connected to the central loop 51 by respective gaps 57 and 58 which extend the entire length of the resonator network 1. The sides of the resonator network 1 are extended at each end to form a recessed area 59, and the coaxial cable 9 enters this recess through a top wall 60. The network 1 is constructed from a ceramic material manufactured by Corning Glass under the Trademark "Macor".

The inner surfaces of the resonator network 1, including the surfaces of the loops 51, 55 and 56 and the gaps 57 and 58, are coated with a conductive layer in a two-step process which is described in the above-cited copending U.S. patent application Ser. No. 361,595. The same coating is applied to the inner surfaces of the recesses 59 at each end of the network 1 to provide a shield. This shield confines the magnetic field and raises the Q of the resonator network 1. A similar conductive coating is laid down in a pattern on the top wall 60 of the resonator network 1 to form the modulation coils 6 and 7.

In the preferred embodiment, the resonator network 1 operates in the x-band with a resonant frequency of 9.5 GHz. The central loop 51 has a diameter of 0.472 inches and the satellite loops 55 and 56 each have a diameter of 0.157 inches. The slots 57 and 58 each have a spacing of 0.098 inches and a width of 0.070 inches. The lengths of all the loops and slots are the same. As explained in the above-cited co-pending U.S. patent application Ser. No. 464,473, the microwave magnetic field produced in the two satellite loops 55 and 56 is identical since their diameters are the same. The sample material contained in the sample tube 5 is thus subjected to the identical microwave field which is applied to a reference sample contained in a tube 61. The reference sample in tube 61 is a liquid containing a spin-label such as CTPO. It has a known level of dissolved oxygen, or it may be de-oxgenated when measuring very low levels of dissolved oxygen in the sample material. As will be explained in more detail below, an ESR signal is produced by the sample material in tube 5 when modulation coil 6 is energized, and an ESR signal is produced by the reference sample 61 when the modulation coil 7 is energized.

Referring to FIG. 1, the resonator network 1 is positioned between magnetic poles 3 and 4. The magnetic poles 3 and 4 are cylindrical in shape and they present a pair of circular pole faces 40 which have a diameter of three and one-half inches and which are spaced one inch apart. The poles 3 and 4 form part of a magnetic circuit which includes permanent magnets (not shown) that produce a uniform magnetic field between the pole faces 40 of approximately 3400 gauss. This polarizing magnetic field ($B_o$) may be adjusted by a bias field produced by a winding 145 which is wound around the pole piece 3. A d.c. power supply 144 drives the bias winding 145, and it is controlled by the control system 18 through a control line 53 to adjust the strength of the polarizing magnetic field ($B_o$). The 100 kiloHertz reference signal applied to either the modulation coil 6 or 7 produces a modulating magnetic field $B_\omega$ of two to three gauss. This modulating magnetic field is added to the polarizing field $B_o$.

The elements of the microwave bridge portion 50 of the spectrometer are commercially available components which are interconnected with coaxial cable. The voltage controlled source oscillator 12 is a voltage controlled gunn diode oscillator which operates over a frequency range of 8.8 to 9.6 GHz. The measurements are made with an incident power of two milliwatts, which produces an ESR signal under conditions of partial microwave power saturation. The microwave circulator 11 is a standard four port circulator such as the model C-8544T-1 available from Teledyne Microwave which circulates the signal from port one to port two and which circulates the reflected signal from port two to port three. The crystal detector 13 is a Schottkey diode from M/A-COM, Inc. which rectifies the radio frequency signal.

To tune the spectrometer, the reference arm 16 in the microwave bridge circuit 50 includes a variable attenuator 41 for controlling the level of microwave power applied to the crystal detector 13 and a variable phase shifter 42 for controlling the phase of the reference microwave energy applied to the detector 13. An attenuator 43 is also connected to the microwave input to the circulator 11 to control the level of the microwave power applied to the resonator 1. The attenuators 41 and 43 as well as the phase shifter 42 are controlled by analog signals output from the control system 18 through respective control lines 31, 33 and 32. While these microwave elements are shown as discrete components, it should be apparent that a single integrated circuit using strip-line technology may also be employed.

Figure 3A:
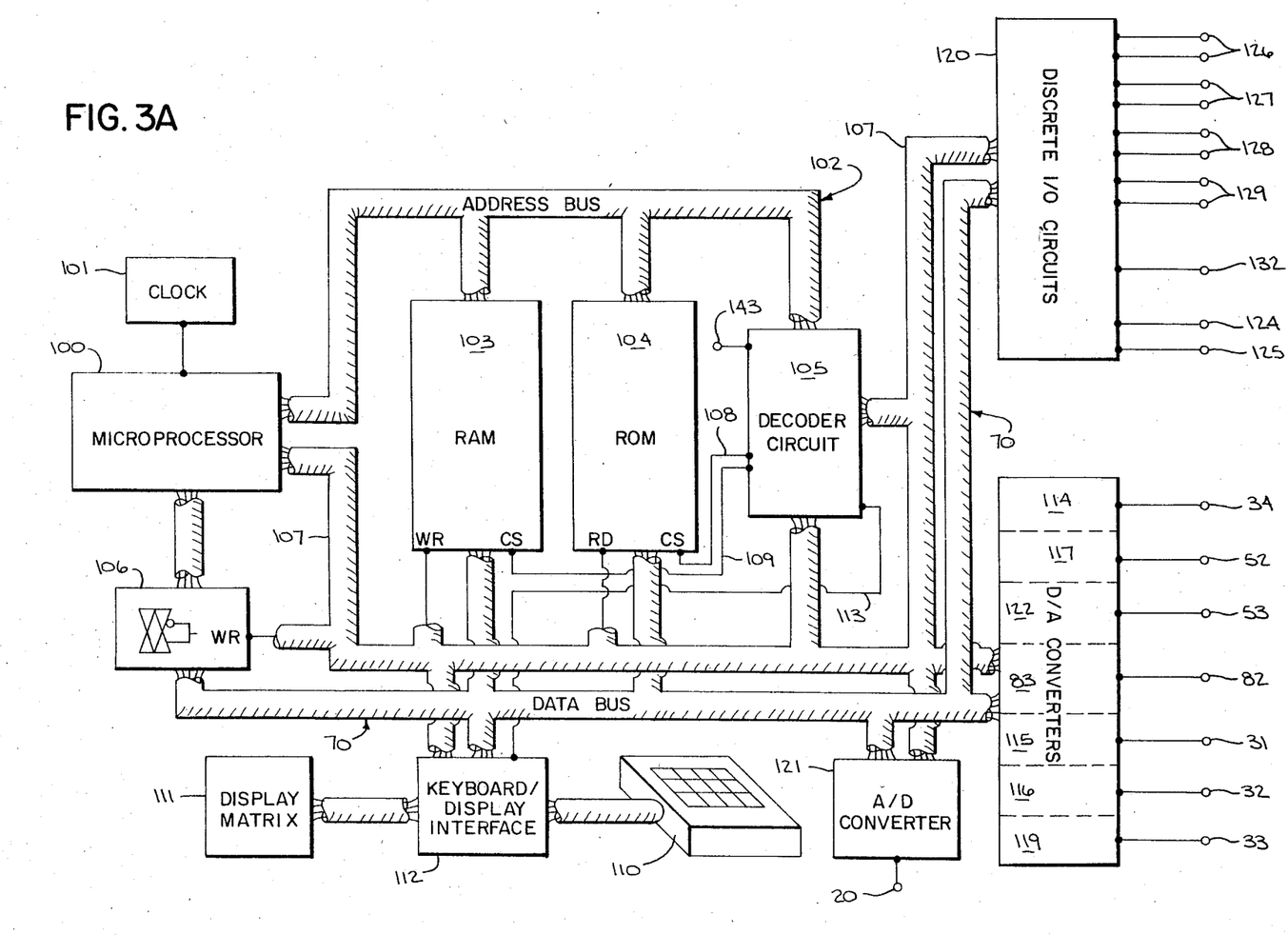
FIGS. 3A and 3B are electrical schematic diagrams of a control system which forms part of the instrument of FIG. 1.

Referring particularly to FIGS. 1 and 3A, the control system 18 is structured about an 8-bit microprocessor 100 which is driven by a clock 101. The microprocessor 100 drives a 16-bit address bus 102 which connects to a random access memory (RAM) 103, a read-only memory (ROM) 104, and a decoder circuit 105. The 8-bit bidirectional data bus 70 is coupled to the microprocessor 100 by bidirectional gates 106, and a control bus 107 connects to the control terminals on the microprocessor 100.

All of the elements in the control system 18 are memory mapped devices which are enabled by the decoder circuit 105 when their address appears on the address bus 102 during a read or write cycle. For example, an 8-bit byte of data is read from the ROM 104 when one of its lines is addressed. In such a read cycle, the decoder circuit 105 generates a logic low signal on chip select control line 108, and a RD control line in the control bus 107 is driven low by the microprocessor 100. Similarly, the RAM 103 is enabled by a chip select control line 109 when a byte of data is to be either written to or read from the RAM 103. The state of a WR control line in the bus 107 determines whether a memory read or memory write operation is to be performed.

The control system 18 is operated through a control panel which is comprised of a keyboard matrix 110 and a display matrix 111. Data in the form of switch, or key, closures is input from the keyboard matrix 110 to a keyboard/display interface circuit 112 which maintains an input image of the state of each switch in the matrix 110. The interface circuit 112 is connected to the data bus 70 and the control bus 107, and when enabled by the decoder circuit 105 through line 113, the contents of this input image may be read by the microprocessor 100. Similarly, the interface circuit 112 maintains an output image which may be written to by the microprocessor 100 to effect the state of display devices in the matrix 111. The keyboard/display interface 112 thus maintains stored images of the state of the devices which comprise the system control panel, and it relieves the microprocessor 100 of the burden of continuously scanning these devices.

Referring still to FIGS. 1 and 3A, the chart recorder 20 is driven by an 8-bit digital-to-analog converter circuit 114 which connects to the data bus 70 and the control bus 107. When enabled by the decoder circuit 105 through a control line in the bus 107, a byte of data is written to the circuit 114 and converted to a corresponding analog signal. The analog signal is amplified and applied to the chart recorder 20 through a line 34.

Similarly, a second digital-to-analog converter 117 connects to the buses 70 and 107 and is enabled by the decoder circuit 105 through a line in the control bus 107. An 8-bit byte of data which is written to the converter 117 is transformed to a corresponding analog signal and applied to the voltage control input of the source oscillator 12 through line 52. As will be explained in more detail below, the frequency of the source oscillator 12 may thus be altered by changing the value of the 8-bit binary number written to the converter 117, and in this manner the source frequency can be adjusted to the precise resonant frequency of the loop-gap resonator network 1.

Similar digital-to-analog converter circuits 115, 116 and 119 are connected to the data bus 70 and control bus 107 and are employed to control the attenuators 41 and 43 and the phase shifter 42. Yet another digital-to-analog converter 122 connects to the buses 70 and 107 and is employed to control the d.c. power supply 144 through line 53. As indicated above, the power supply 144 provides d.c. current to the field bias coil 145 to adjust the magnitude of the polarizing magnetic field produced by the permanent magnets 3 and 4. Such adjustments are made during both the calibration and measurement phases of operation as will be described in more detail below.

An analog-to-digital converter 121 also connects to the buses 70 and 107, and it receives the signal on line 20 from the crystal detector 13. This signal is monitored when the source oscillator 12 is being tuned to the resonant frequency of the network 1.

The various pumps and valves which control the supply of sample material to the spectrometer are controlled through a set of discrete input/output circuits indicated generally at 120. The circuits 120 connect to the data bus 70 and control bus 107 through a parallel I/O interface circuit, and it is enabled by the decoder circuit 105 through a control line in the bus 107. The I/O circuit 120 includes six outputs and one input. The single bit input connects through a line 132 to the level sensor 29 on the mixing tank 22. Four of the outputs connect to respective pumps 21, 23, 25 and 28 through lines 126–129 and two of the outputs 124 and 125 connect to the reference oscillator circuit in FIG. 3B.

Figure 3B:
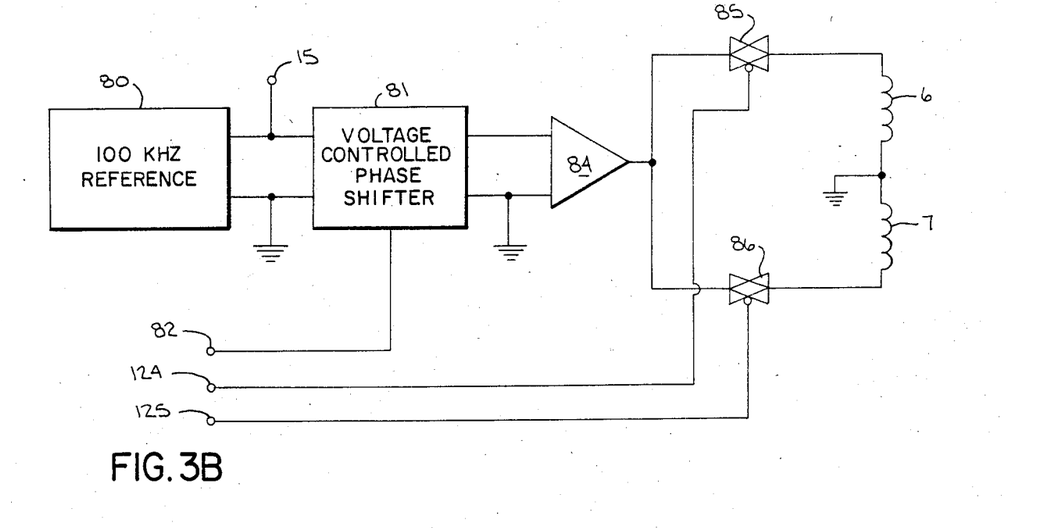

Referring particularly to FIGS. 3A and 3B, the reference oscillator circuit forms part of the control system 18. It includes a 100 kiloHertz reference oscillator 80 which generates a sinusoidal reference signal to a voltage controlled phase shifter 81. The same reference signal is applied through line 15 to the phase detector 14 (FIG. 1). The voltage controlled phase shifter 81 shifts the phase of the incoming signal from 0 to 180 degrees in response to an analog control signal on a line 82. This control line 82 is driven by a separate digital-to-analog converter circuit 83 which is connected to the data bus 70 and control bus 107 of the control system 18. The phase of the 100 kiloHertz reference signal which is output by the phase shifter 81 and applied to an amplifier 84 may thus be precisely controlled by writing the appropriate binary number to the digital-to-analog converter 83.

Referring particularly to FIGS. 3B and 2, the output of the power amplifier 84 is applied to a pair of analog switches 85 and 86. The analog switch 85 connects to the modulation coil 6 associated with the sample 5 being tested, and the analog switch 86 connects to the modulation coil 7 associated with the reference sample 61. The switches 85 and 86 are turned on and off by the digital signals on respective output lines 124 and 125, and the modulation coils 6 and 7 may thus be energized and de-energized in response to program instructions executed by the microprocessor 100. A shorted conductive turn may be wrapped around the resonator network 1, between the modulation coils 6 and 7 to further isolate their fields.

The control system 18 operates the spectrometer elements in accordance with a set of machine instructions stored in the ROM 104. These instructions are read from the ROM 104 by the microprocessor 100 and executed to sequentially operate the system elements. The operation of the spectrometer will now be described with reference to FIG. 4 which is a flowchart of the programs stored in the ROM 104.

Figure 4:
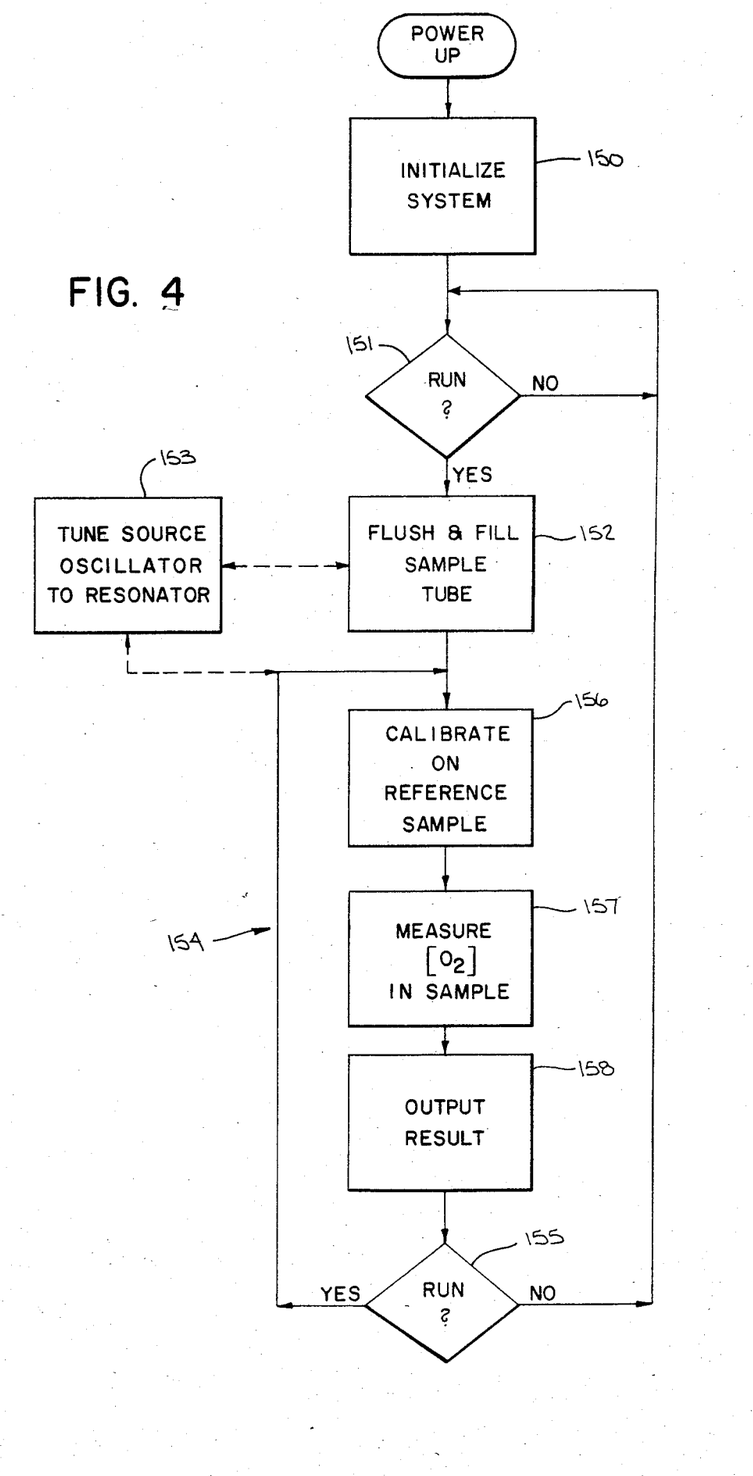
FIGS. 4 and 5 are flowcharts of the programs executed by a microprocessor in the control system of FIG. 3A.

Referring particularly to FIGS. 3A and 4, when the system is first powered up a number of instructions indicated by process block 150 are executed to initialize the hardware elements and the data structures stored in the RAM 103. Such initialization includes turning off all of the pumps 21, 13, 25 and 28, and disabling the reference oscillator 80 (FIG. 3B) and the source oscillator 12. Counter and timer data structures in the RAM 103 are also initialized and then the operator is prompted to enter set-up data through the keyboard 110. Such set-up data includes the cycle times and other variables related to the oxygen concentration measurement being made.

Referring to FIGS. 1 and 4, the status of a mode switch in the display matrix 111 is then input and examined. If the switch is set to the "RUN" mode, as determined at decision block 151, the measurement sequence is begun. As indicated at process block 152, the sample tube 5 is flushed with deaerated water from tank 27 and sample material is then pumped into the tube 5 from the tank 22.

A subroutine indicated at process block 153 is called to tune the source oscillator 12 to the resonant frequency of the network 1. This is accomplished by turning off the modulation coils 6 and 7, switching the microwave bridge 50 to the "absorption" mode of operation and then sweeping the frequency of the source oscillator 12 through resonance. The switch to absorption mode is accomplished by setting the phase shifter 42 to zero degrees through D/A convertor 116, and applying a ramped voltage to the source oscillator 12 through D/A convertor 117. The magnitude of the voltage output from the crystal detector 13 is monitored through A/D convertor 121, and the frequency at which the minimum signal is produced is determined. The source oscillator is then set to this frequency through control line 52.

A loop indicated at 154 is then entered in which the system is repeatedly calibrated on the reference sample and then used to measure the oxygen concentration of the material in the sample tube. This loop is exited at decision block 155 when the operator switches the system out of the RUN mode.

Figure 5:
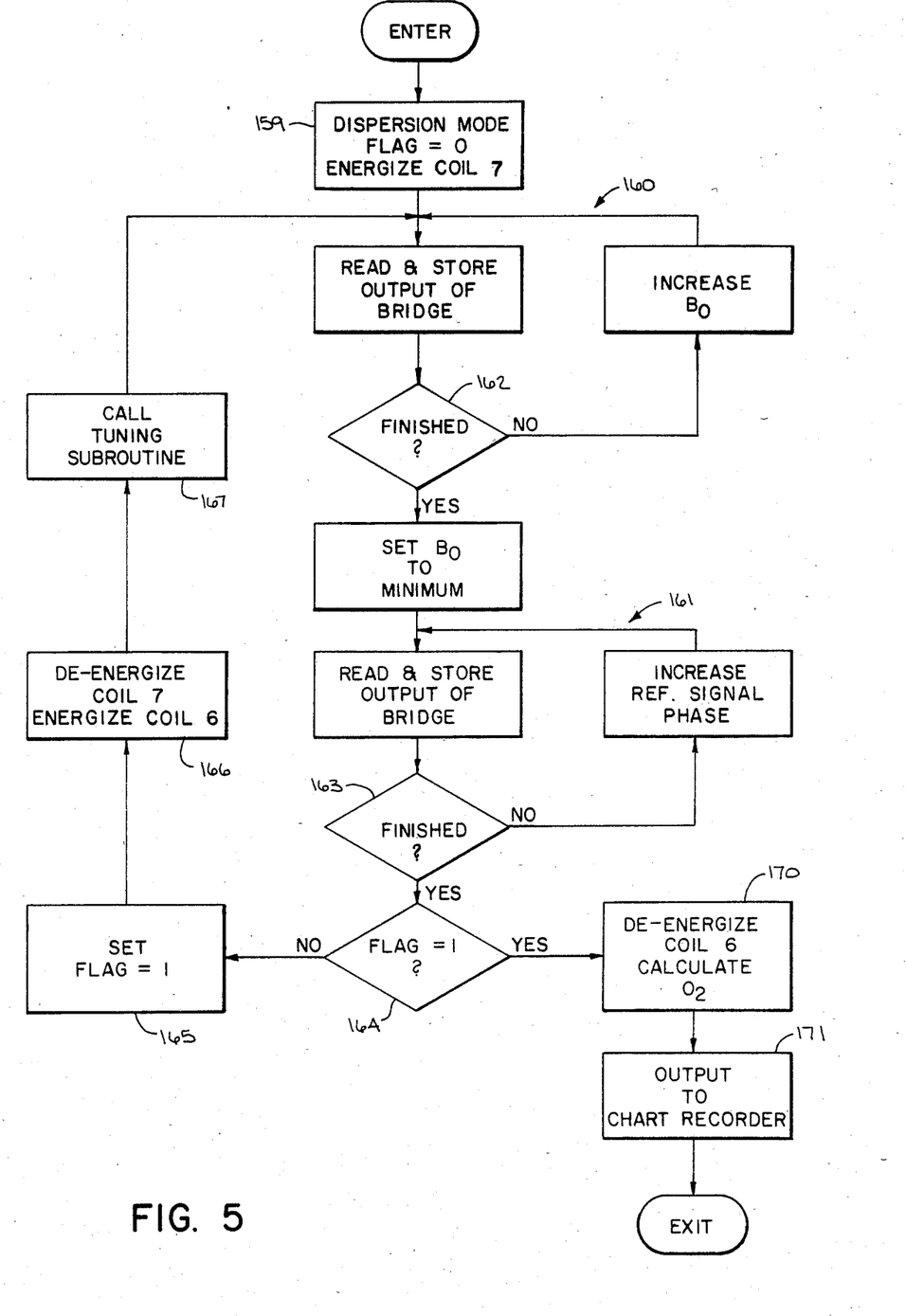

The calibration, measurement and output processes shown as process blocks 156–158 in FIG. 4 are shown in more detail in FIG. 5. As indicated at process block 159, the calibration and measurement processes are carried out with the microwave bridge 50 set to the "dispersion" mode. This is accomplished by setting the phase shifter 42 to a 90 degree phase-shift so that the detector 13 will detect the quadrature component of the ESR signal reflected from the sample in the resonator network 1.

Figure 6A:
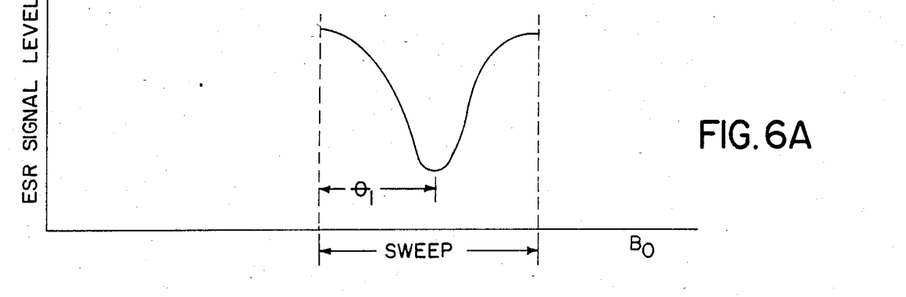
FIG. 6A in a plot of phase detector output signal versus polarizing field strength.

After setting a FLAG to zero and energizing the modulation coil 7, the system is then calibrated on the reference sample 61. This is accomplished in two steps indicated generally by the loops 160 and 161. In the loop 160, the output level of the microwave bridge 50 is read and stored as the level of the polarizing magnetic field is swept through a range of values. As indicated above, this is accomplished by controlling the magnitude of the bias field produced by the coil 145 (FIG. 1) and by reading the output of the phase detector 14. A plot of the phase detector output signal versus polarizing field strength is illustrated in FIG. 6A, and after the sweep is completed as determined at decision block 162, the value of $B_o$ which produces the minimum output signal is calculated. The bias coil 145 is then energized to produce this value of $B_o$, as indicated by process block 163.

Figure 6B:
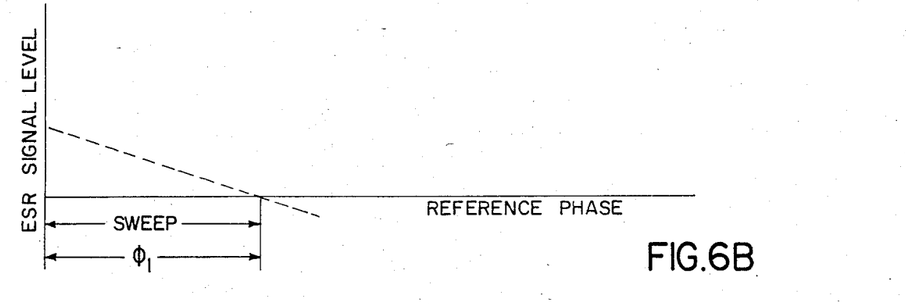
FIG. 6B is a plot of bridge output voltage versus phase of a reference signal.

The second step in the process is to sweep the phase of the reference signal applied to the modulation coil 7 through a range of values and read the amplitude of the signal produced by the microwave bridge 50. As indicated above, this is accomplished by outputting a series of increasing values to the D/A converter 83 (FIG. 3A) which controls the phase shifter 81 (FIG. 3B), and by reading the resulting signal produced by the phase detector 14 (FIG. 1). A plot of the bridge output voltage (ESR SIGNAL AMPLITUDE) versus the phase of the reference signal is shown in FIG. 6B. When the bridge output reaches a predetermined magnitude (zero volts in the preferred embodiment), the sweep is completed and the value $\phi_1$ of the reference phase is stored.

Referring again to FIG. 5, when the calibration is complete, as indicated at decision block 163, the FLAG is checked at decision block 164, and the system loops back to perform the measurement sequence. The FLAG is set to "1" at process block 165, and the modulation coil 7 is de-energized and the modulation coil 6 energized at process block 166. The subroutine 153 is then called to retune the source oscillator 12 as indicated at process block 167 and the two step measurement process is repeated on the sample material in tube 5.

Figure 6C:
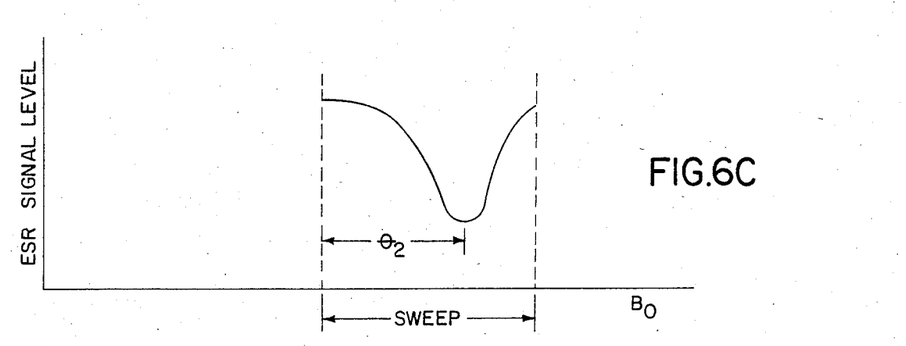
FIG. 6C shows sweeping of the polarizing field Bo through a range of values to produce a series of bridge output voltages.
Figure 6D:
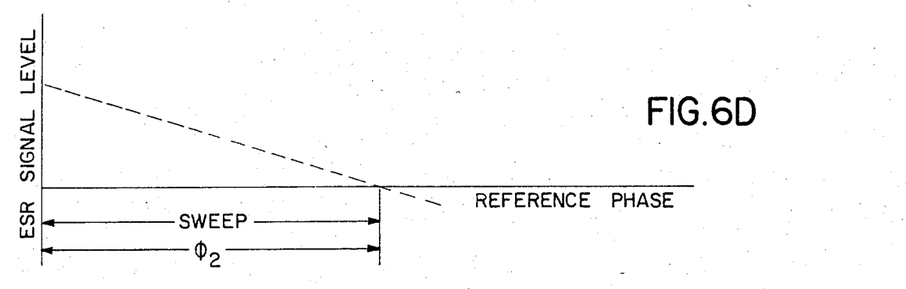
FIG. 6D shows an increase in the phase of the reference signal applied to modulation coil 6.

As shown in FIG. 6C, the value of the polarizing field $B_o$ is swept through a range of values to produce a series of bridge output voltages. The polarizing bias field $\theta_2$ which produces the minimum output voltage is thus determined and is applied to the resonator network 1 while the second step in the measurement cycle is executed. As shown in FIG. 6D, during the second step the phase of the reference signal applied to the modulation coil 6 is increased through a range of values and the output of the microwave bridge 50 is monitored. When the output reaches the predetermined measurement value (zero volts), the magnitude of the reference signal phase angle ($\phi_2$) is read and stored.

Referring again to FIG. 5, when the values of $\phi_1$ and $\phi_2$ have been measured by the above-described sequence of steps, the system exits at decision block 164. The modulation coil 6 is de-energized and the oxygen concentration [$O_2$] is calculated, as indicated at process block 170. This cycle may be performed repetitively at a rate which will depend on the circumstances, for example, 25 cycles per second.

It is a teaching of the present invention that the oxygen concentration [$O_2$] in the sample material is equal to that in the reference sample plus an amount which is proportional to the phase difference ($\phi_1 - \phi_2$) of the ESR signals produced by the sample and the reference material. If the reference material is de-oxygenated, the dissolved oxygen concentration may be calculated as follows:

$$[O_2] = K(\phi_1 - \phi_2)$$

where:

K is a constant at lower oxygen concentrations which can be measured for any system, and at higher oxygen concentrations, K changes in a known manner.

This calculated value of the oxygen concentration is output to the chart recorder 20, as indicated at process block 171 and the system repeats the entire sequence until the instrument is switched out of the "RUN" mode. A series of oxygen concentration measurements may thus be made and plotted as a function of time. It should also be apparent, however, that with further calculation by the microprocessor 100 other quantities, such as cellular respiration rate, may be calculated.

There are a number of variations which can be made from the above-described preferred embodiment of the invention. For example, if the amount of spin-label in both the reference material and the sample material is precisely known, the second step in the above-described calibration and measurement process is not required. Instead, the magnitudes of the ESR signal at its minimum in FIG. 6A and its minimum in FIG. 6C are measured and stored. The oxygen concentration [$O_2$] is then calculated using both the difference between these two stored values and the known difference in spin-label concentration.

Figure 7:
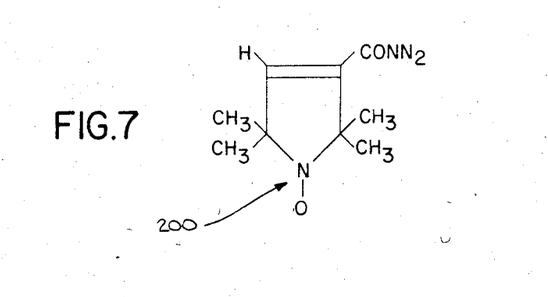
FIG. 7 shows a nitrogen isotope in the CTPO spin-label molecule.

Yet another variation is possible in which the sample material and the reference material are excited by a single modulation coil. In such case, the spin-label used in the reference material is different than that used in the sample material and its Larmor frequency is different. For example, chemically identical spin-labels such as CTPO may be employed, but one spin-label contains the nitrogen isotope $^{14}N$ and the other contains the isotope $^{15}N$. As shown in FIG. 7, for example, the nitrogen isotope is shown at 200 in the CTPO spin-label molecule. Calibration is accomplished by stepping the polarizing magnetic field $B_o$ to a value which produces resonance in the reference material and then performing the above-described measurement sequence. The polarizing magnetic field $B_o$ is then stepped back to a value which produces resonance in the sample, and the measurement sequence is repeated. Instead of providing "spatial" separation of the sample and reference materials, therefore, it is possible to "separate" the sample from the reference material using the polarizing magnetic field strength. Consequently, the reference material and the sample material may be positioned together in the loop of a single-loop, loop-gap resonator.

Yet another variation is possible in which the reference material and the sample material are one and the same. In such case, reference information is obtained by applying low incident microwave power and then shifting the attenuators 41 and 43 to obtain the sample information at higher power levels. Dissolved oxygen concentration is proportional, as before, to the phase difference between the two reflected ESR signals and the difference in applied power levels.

Those skilled in the art can appreciate that there are other automatic frequency control techniques which may be employed to keep the source oscillator tuned to the resonant frequency of the resonator network 1. Some of these are described in "Electron Spin Resonance", pages 87–91, by Charles P. Poole, Jr. and published in 1983 by John Wiley & Sons. The particular technique chosen will depend on the environment in which the instrument is used.

We claim:

1. An instrument for measuring the oxygen concentration in a sample material, the combination comprising:
a standard material of known oxygen concentration;
means for concurrently applying a polarizing magnetic field to the sample material and the standard material;
means for modulating the strength of the polarizing magnetic field at a reference frequency;
means for concurrently applying a source magnetic field to the sample material and the standard material at a frequency which produces paramagnetic resonance in free radicals contained in the sample material and the standard material;
means coupled to the last named means for sensing the signal produced by the resonating free radicals in both the standard material and the sample material;
means coupled to the last named means for detecting the dispersion component of each sensed signal to produce a first reference frequency signal having a phase determined by the oxygen concentration in the sample material and a second reference frequency signal having a phase determined by the oxygen concentration in the standard material; and
processor means coupled to the last named means for comparing the phases of the first and second reference frequency signals and producing a signal indicative of the oxygen concentration in the sample material.

2. The instrument as recited in claim 1 in which the means for applying the source magnetic field to the sample material and the standard material includes a loop-gap resonator.

3. The instrument as recited in claim 2 in which the loop-gap resonator includes two loops, with the standard material disposed in one loop and the sample material disposed in the other loop.

4. The instrument as recited in claim 2 in which the loop-gap resonator includes a central loop, a first satellite loop containing the standard material, and a second satellite loop containing the sample material.

5. The instrument as recited in claim 3 or 4 in which the means for applying the source magnetic field includes a microwave bridge which is coupled to the loop-gap resonator by a coupling loop positioned adjacent one of the loops of the loop-gap resonator.

6. An instrument for measuring the oxygen concentration in a sample material, the combination comprising:
a microwave bridge for producing electromagnetic energy at a source frequency and applying it to a coupling loop, and being operable to sense signals reflected back into said coupling loop;
a loop-gap resonator network positioned adjacent to the coupling loop and including a first loop for containing the sample material mixed with a free radical and a second loop for containing a standard material mixed with a free radical;
means for applying a polarizing magnetic field to the loop-gap resonator network to produce paramagnetic resonance in the free radicals mixed with the sample material and the standard material, such paramagnetic resonance inducing signals in the coupling loop which is reflected back to the microwave bridge;
a detector coupled to the microwave bridge for producing a first signal which is indicative of the phase of the paramagnetic resonance signal produced by the free radicals mixed with the sample material, and a second signal which is indicative of the phase of the paramagnetic resonance signal produced by the free radicals mixed with the standard material; and
processor means connected to the detector and being operable to produce an oxygen concentration signal which is proportional to the phase difference between said first and second signals produced by the detector.

7. The instrument as recited in claim 6 which further includes:
a reference oscillator coupled to the processor means;
a first modulation coil coupled to the reference oscillator and positioned adjacent the first loop in the resonator network to modulate the amplitude of the polarizing magnetic field applied to the sample material when energized by the reference oscillator;
a second modulation coil coupled to the reference oscillator and positioned adjacent the second loop in the resonator network to modulate the amplitude of the polarizing magnetic field applied to the standard material when energized by the reference oscillator; and
in which the processor means controls the reference oscillator to energize the first modulation coil when the phase of the paramagnetic resonance signal produced by the sample material is to be detected and to energize the second modulation coil when the phase of the paramagnetic resonance signal produced by the standard material is to be detected.

8. The instrument as recited in claim 7 in which the microwave bridge includes a detector which receives the paramagnetic resonance signals produced in the loop-gap resonator network and a source frequency signal which is out of phase substantially ninety degrees with respect to the source frequency electromagnetic energy applied to the coupling loop.

9. The instrument as recited in claim 1 in which the free radicals contained in the sample material is a first spin-label which resonates when the polarizing magnetic field is at a first magnitude, and the free radicals contained in the reference material is a second spin-label which has chemical properties substantially the same as the chemical properties of the first spin-label, but which resonates when the polarizing magnetic field is a second magnitude; and the means for applying a polarizing magnetic field includes bias means for changing the magnitude of the polarizing magnetic field between said first and second magnitudes.

10. The instrument as recited in claim 9 in which the difference between the first and second spin-labels is produced by the inclusion of different isotopes of nitrogen.

* * * * *

UNITED STATES PATENT AND TRADEMARK OFFICE
CERTIFICATE OF CORRECTION

PATENT NO. : 4,593,248
DATED : June 3, 1986
INVENTOR(S) : Hyde et al.

It is certified that error appears in the above-identified patent and that said Letters Patent is hereby corrected as shown below:

Col. 1, line 3: Insert the following as the first paragraph:

--This invention was made with government support under Federal Grant NIH RR-01008 awarded by the National Institutes of Health. The government has certain rights in the invention.--

Signed and Sealed this

Twenty-seventh Day of April, 1993

Attest:

MICHAEL K. KIRK

Attesting Officer

Acting Commissioner of Patents and Trademarks